US010175328B2

United States Patent
Hoge et al.

(10) Patent No.: US 10,175,328 B2
(45) Date of Patent: Jan. 8, 2019

(54) SYSTEM AND METHOD FOR RECONSTRUCTING GHOST-FREE IMAGES FROM DATA ACQUIRED USING SIMULTANEOUS MULTISLICE MAGNETIC RESONANCE IMAGING

(71) Applicant: BRIGHAM AND WOMEN'S HOSPITAL, INC., Boston, MA (US)

(72) Inventors: William Scott Hoge, Watertown, MA (US); Jonathan R Polimeni, Cambridge, MA (US); Kawin Setsompop, Charlestown, MA (US)

(73) Assignee: THE BRIGHAM AND WOMEN'S HOSPITAL, Boston, MA (US)

( * ) Notice: Subject to any disclaimer, the term of this patent is extended or adjusted under 35 U.S.C. 154(b) by 122 days.

(21) Appl. No.: 15/231,267

(22) Filed: Aug. 8, 2016

(65) Prior Publication Data

US 2017/0038450 A1 Feb. 9, 2017

Related U.S. Application Data

(63) Continuation-in-part of application No. PCT/US2015/045901, filed on Aug. 19, 2015.
(Continued)

(51) Int. Cl.
*G01V 3/00* (2006.01)
*G01R 33/561* (2006.01)
(Continued)

(52) U.S. Cl.
CPC ...... *G01R 33/5611* (2013.01); *G01R 33/4835* (2013.01); *G01R 33/561* (2013.01);
(Continued)

(58) Field of Classification Search
CPC .. G01R 33/4835; G01R 33/561; G01R 33/56; G01R 33/565; G01R 33/5611
(Continued)

(56) References Cited

U.S. PATENT DOCUMENTS 9,476,959 B2 * 10/2016 Dannels ........... G01R 33/56554
9,606,210 B2 * 3/2017 Dannels ........... G01R 33/56554
(Continued)

FOREIGN PATENT DOCUMENTS

WO 2015/031560 3/2015

OTHER PUBLICATIONS

Cauley, et al., in "Interslice Leakage Artifact Reduction Technique for Simultaneous Multislice Acquisitions," Magnetic Resonance in Medicine, 2014; 72(1):93-102.
(Continued)

*Primary Examiner* — Amy He
(74) *Attorney, Agent, or Firm* — Quarles & Brady LLP

(57) ABSTRACT

Systems and methods for combined ghost artifact correction and parallel imaging reconstruction of simultaneous multislice ("SMS") magnetic resonance imaging ("MRI") data are provided. Dual-polarity training data are used to generate ghost-free slice data, which are used as target data in a reconstruction kernel training process. The training data are used as source data in the reconstruction kernel training. As a result, reconstruction kernels are computed, which can be used to reconstruct images from SMS data in which slice-specific ghosting artifacts are removed.

16 Claims, 5 Drawing Sheets

Related U.S. Application Data

(60) Provisional application No. 62/201,656, filed on Aug. 6, 2015, provisional application No. 62/041,337, filed on Aug. 25, 2014.

(51) Int. Cl.
  *G01R 33/565* (2006.01)
  *G01R 33/483* (2006.01)

(52) U.S. Cl.
  CPC ..... *G01R 33/565* (2013.01); *G01R 33/56554* (2013.01); *G01R 33/5616* (2013.01)

(58) Field of Classification Search
  USPC .................................................. 324/309, 307
  See application file for complete search history.

(56) References Cited

U.S. PATENT DOCUMENTS

| | | |
|---|---|---|
| 2006/0066308 A1 | 3/2006 | Hinks et al. |
| 2014/0037171 A1 | 2/2014 | Bhat et al. |

OTHER PUBLICATIONS

Feinberg et al., "Ultra-fast MRI of the human brain with simultaneous multi-slice imaging," J Magn Reson, vol. 229, pp. 90-100, 2013.

Graedel et al., "An anatomically realistic temperature phantom for radiofrequency heating measurements," Magn Reson Med, vol. 73, No. 1, pp. 442-450, 2015.

Griswold, et al., "Generalized autocalibrating partially parallel acquisitions (GRAPPA)," Magn Reson Med, vol. 47, No. 6, pp. 1202-1210, Jun. 2002.

Hoge, et al., in "Robust EPI Nyquist Ghost Elimination via Spatial and Temporal Encoding (EPI-GESTE)," Magnetic Resonance in Medicine, 2010; 64(6):1781-1791.

Hoge et al., "Dual-polarity GRAPPA for simultaneous reconstruction and ghost correction of EPI data," Magn Reson Med, 2016, 76(1):32-44.

Keil et al., "Design optimization of a 32-channel head coil at 7T," in Proc of the ISMRE/ESMRMB Joint Annual Meeting, 2010, p. 1493.

Larkman et al., "Parallel magnetic resonance imaging," Phys in Medicine and Biology, vol. 52, No. 7, pp. R15-R55, Apr. 2007.

Moeller et al., "Multiband multislice GE-EPI at 7 tesla, with 16-fold acceleration using partial parallel imaging with application to high spatial and temporal whole-brain fMRI," Magn Reson Med, vol. 63, No. 5, pp. 1144-1153, 2009.

Polimeni et al., "Reducing sensitivity losses due to respiration and motion in accelerated Echo Planar Imaging by reordering the autocalibration data acquisition," Magn Reson Med, vol. 75, No. 2, pp. 665-679, 2016.

Setsompop et al., "Blipped-controlled aliasing in parallel imaging for simultaneous multislice echo planar imaging with reduced g-factor penalty," Magn Reson Med, vol. 67, No. 5, pp. 1210-1224, 2012.

Setsompop et al., "Improving diffusion MRI using simultaneous multi-slice echo planar imaging," NeuroImage, vol. 63, No. 1, pp. 569-580, 2012.

Zhu, et al., "Nyquist ghosting correction for simultaneous multislice echo planar imaging," in Proc of the 22nd Annual ISMRM Meeting, 2014, 0647 (Abstract Only).

International Search Report and Written Opinion for PCT/US2015/045901, dated Nov. 24, 2015, 14 pages.

\* cited by examiner

SYSTEM AND METHOD FOR RECONSTRUCTING GHOST-FREE IMAGES FROM DATA ACQUIRED USING SIMULTANEOUS MULTISLICE MAGNETIC RESONANCE IMAGING

CROSS-REFERENCE TO RELATED APPLICATIONS

This application claims the benefit of U.S. Provisional Patent Application 62/201,656, filed Aug. 6, 2015, entitled "Systems and Methods of Artifact Correcting Parallel MRI". This application is also a Continuation-In-Part of International Application PCT/US2015/045901, filed Aug. 19, 2015, entitled "System and Method for Dual-Kernel Image Reconstruction," which claims the benefit of U.S. Provisional Patent Application 62/041,337, filed Aug. 25, 2014. All of which are incorporated herein by reference for all purposes.

STATEMENT REGARDING FEDERALLY SPONSORED RESEARCH

This invention was made with government support under EB019437 awarded by the National Institutes of Health. The government has certain rights in the invention.

BACKGROUND OF THE INVENTION

Echo planar imaging ("EPI") is a rapid imaging technique that is widely employed in magnetic resonance imaging ("MRI") for its ability to accurately image physiological states at extremely short time-scales (e.g., around 60 ms). Today, EPI is the primary method for acquiring functional MRI data of the brain, and is also widely used for diffusion and perfusion imaging throughout the body.

Although EPI is a key technology for both clinical and research applications, it is intrinsically vulnerable to specific image artifacts, such as geometric distortion due to spatially varying magnetic susceptibility across tissue that cause magnetic field inhomogeneity in the imaging volume, and "ghosting artifacts" due to stray magnetic fields and acquisition timing inaccuracies caused by scanner hardware imperfections.

The first of these two classes of artifact, geometric distortion, can be largely circumvented by employing accelerated parallel imaging techniques that are enabled by the use of arrays of surface coil detectors that are now standard components in modern MRI scanners. By skipping a portion of the image encoding process, the EPI data can be acquired more quickly, limiting the accrual of distortions with time. This missing information can be estimated in software during image reconstruction (e.g., using parallel imaging methods such as GRAPPA) through utilizing the complementary information provided by the various channels of the detector array.

The second artifact, image ghosting, can be removed through acquiring a small amount of additional data, known as phase navigators, that are used to estimate the phase errors which give rise to the ghosting. Once these navigators are acquired, a phase error correction can also be performed in software during image reconstruction. Both parallel imaging reconstruction and ghost correction require additional calibration data—fully-sampled reference data in the case of parallel imaging and line navigators in the case of ghost correction.

A recently developed technology known as simultaneous multislice ("SMS") MRI can dramatically increase the temporal efficiency of EPI. Because in conventional EPI the stack of imaging slices are acquired sequentially, more image slices require longer imaging times. In SMS-EPI, multiple slices (e.g., 8 or 10) can be acquired simultaneously to reduce scan time. The simultaneously acquired slices can be separated during image reconstruction using parallel imaging techniques, such as the slice-GRAPPA technique.

An advantageous technology for obtaining high-quality images using the SMS-EPI technique is controlled aliasing or "CAIPIRINHA" (CAIPI for short), which tailors the sampling of the simultaneously-acquired slices in order to improve the separation of the slices during image reconstruction, which also provides improved signal-to-noise ratio ("SNR"). A variant of CAIPI used for SMS-EPI is known as blipped-CAIPI.

Because SMS-EPI is based on EPI, it still is vulnerable to the same geometric distortion and ghosting artifacts described above. SMS-EPI is compatible with conventional "in-plane" acceleration using techniques such as GRAPPA to reduce image distortions, although the use of "slice acceleration" (also referred to as "through-plane" acceleration) when acquiring multiple slices simultaneously can limit the use of in-plane acceleration because higher levels of in-plane acceleration restrict the amount of CAIPI shifting that can be performed.

Ghost correction in SMS-EPI is particularly challenging because each simultaneously acquired slice will typically have a distinct ghost level, necessitating a slice-specific ghost correction. But, the collapsing of the slices (as well as the navigators) prevents a direct ghost correction using standard methods. For this reason adaptations of conventional ghost correction approaches have been attempted, but the ghost artifacts cannot typically be completely eliminated. Nevertheless, the utilization of SMS-EPI is rapidly growing due to the enormous advantages in terms of both temporal efficiency and temporal resolution it affords.

Previously, it has been demonstrated that conventional techniques employed for ghost correction fail in regions near to steep spatial gradients of magnetic susceptibility (e.g., near the air-tissue interfaces proximal to the frontal sinuses and ear canals bordering the brain). These failures were attributed to spatially nonlinear phase errors, which conventional ghost correction techniques—based on calculating spatially linear phase errors from navigator signals—were not designed to address.

By embedding ghost correction into an image reconstruction technique utilized for in-plane accelerated parallel imaging reconstruction (e.g., GRAPPA) could successfully remove these nonlinear phase errors while concurrently performing the image reconstruction necessary for in-plane accelerated EPI. This technique, which was referred to as dual-polarity GRAPPA ("DPG"), provided improved quality image reconstructions in otherwise difficult-to-image regions near air-tissue interfaces.

The basis of the DPG technique was to acquire two frames of calibration data with equal but opposite polarity readout gradients. In this data, EPI phase errors will cancel, from which a ghost-free image was calculated using the GESTE method. To form a set of reconstruction kernels, the two frames were interleaved to form two source images—one each from the different readout polarities—then, GRAPPA kernels were trained using these two frames as source data together with the ghost-free data as a target. This technique was developed for conventional, in-plane accelerated EPI, however.

Thus, there remains a need to provide a method for reconstructing ghost-free images from data acquired using SMS acquisitions, such as SMS-EPI acquisitions.

SUMMARY OF THE INVENTION

The present invention overcomes the aforementioned drawbacks by providing a method for reconstructing images of a subject using a magnetic resonance imaging ("MRI") system. Training data acquired from a subject are provided to a computer system. The training data includes first training data acquired from a plurality of different slices in the subject using a first series of alternating readout gradients, and second training data acquired from the plurality of different slices in the subject using a second series of alternating readout gradients that have opposite polarity from the first series of alternating readout gradients. Ghost-free data are generated from the training data for each of the plurality of different slices in the subject using the computer system, With the computer system, positive readout data are generated by combining k-space lines in the first training data acquired with a positive readout gradient and k-space lines in the second training data acquired with a positive readout gradient. Likewise, with the computer system, negative readout data are generated by combining k-space lines in the first training data acquired with a negative readout gradient and k-space lines in the second training data acquired with a negative readout gradient. The computer system is then used to synthesize first and second collapsed slice data from the positive and negative readout data. The first collapsed slice data synthesizes the positive readout data from each of the plurality of different slices in the subject as having been acquired simultaneously, and the second collapsed slice data synthesizes the negative readout data from each of the plurality of different slices in the subject as having been acquired simultaneously. A reconstruction kernel is computed for each of the plurality of different slice locations in the subject using a training algorithm in which the first and second collapsed slice data are used as source data and the ghost-free data are used as target data. Data are then simultaneously acquired from the plurality of different slices in the subject using an MRI system performing a simultaneous multislice acquisition pulse sequence. Images of each of the plurality of different slices are reconstructed by applying the reconstruction kernels to the acquired data with the computer system, wherein the images are substantially free from ghost artifacts.

It is another aspect of the invention to provide a computer-implemented method for computing reconstruction kernels for reconstructing images from magnetic resonance data simultaneously acquired from a plurality of different slices in a subject using an MRI system. First training data are acquired from the plurality of different slices in the subject using the MRI system performing a first pulse sequence having a first series of alternating readout gradients, and second training data are acquired from the plurality of different slices in the subject using the MRI system performing a second pulse sequence having a second series of alternating readout gradients that have opposite polarity from the first series of alternating readout gradients. From the first and second training data, ghost-free data are generated for each of the plurality of different slices in the subject. From the first and second training data, collapsed slice data is synthesized, wherein the collapsed slice data synthesizes the first and second training data from each of the plurality of different slices in the subject as having been acquired simultaneously. A reconstruction kernel is computed for each of the plurality of different slice locations in the subject using a training algorithm in which the collapsed slice data are used as source data and the ghost-free data are used as target data. The reconstruction kernels can then be stored in a computer system for later use.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for combined ghost artifact correction and parallel imaging reconstruction of simultaneous multislice ("SMS") magnetic resonance imaging ("MRI") data. In some examples, a dual-polarity GRAPPA ("DPG") method is adapted for reconstructing images from data acquired using an SMS echo-planar imaging ("EPI") acquisition. The adaptation of DPG to SMS-EPI allows for separating the simultaneously-acquired slices in the same step as removing slice-specific ghosting artifacts. Thus, in some instances the methods described here may be referred to as DPG-SMS methods.

The concept of embedding ghost correction into parallel imaging reconstruction described here is not limited to the GRAPPA method, but can also be applied to other k-space or image-space parallel imaging methods. Moreover, the technique described here can be applied to SMS-EPI with or without blipped CAIPI. The technique described here is also compatible with other acquisition techniques, such as the LeakBlock (split slice-GRAPPA) image reconstruction approach, which is described by S. F. Cauley, et al., in "Interslice Leakage Artifact Reduction Technique for Simultaneous Multislice Acquisitions," *Magnetic Resonance in Medicine*, 2013; 72(1):93-102. The techniques described here are also applicable to all forms of EPI, including gradient echo and spin echo, and can be used for EPI employed in imaging function, structure, diffusion, perfusion, phase, susceptibility, permeability, and so on.

Figure 1:
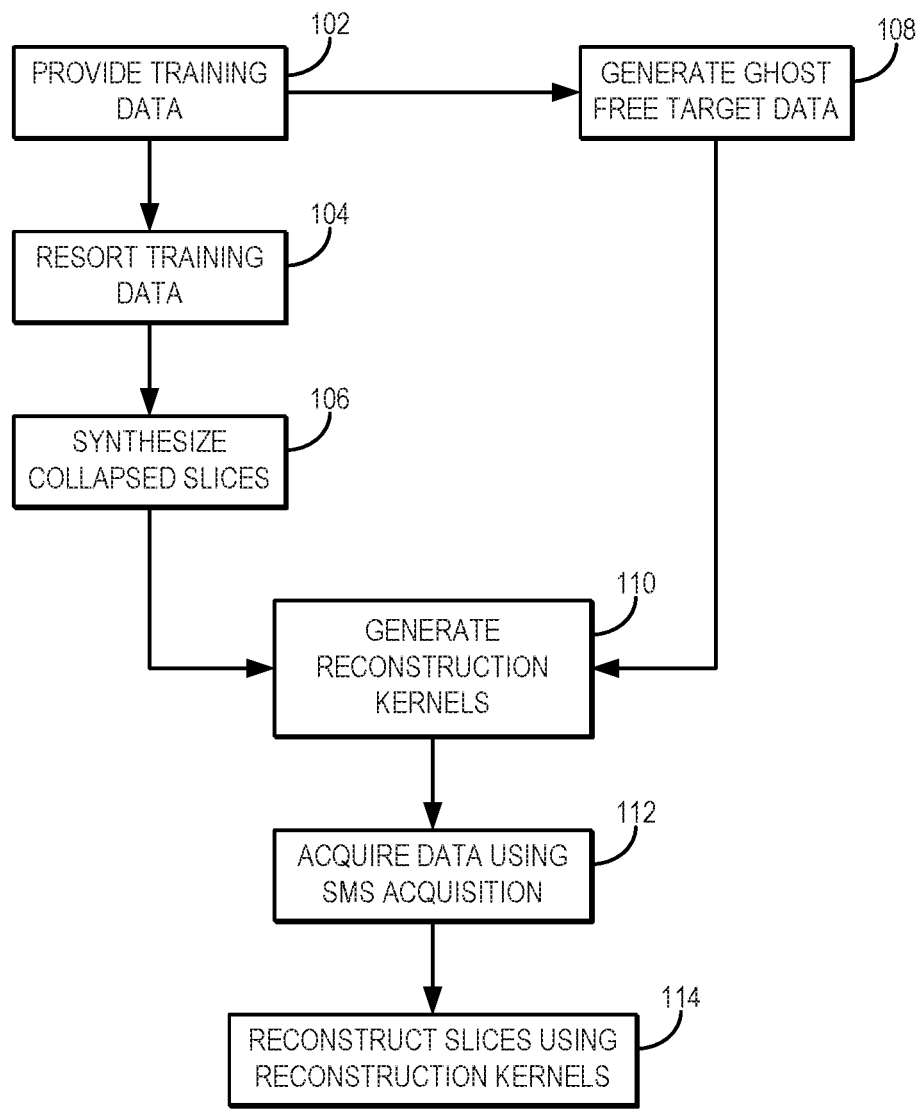
FIG. 1 is a flowchart setting forth the steps of an example method for reconstructing ghost-free images from data acquired using a simultaneous multislice ("SMS") acquisition.

Referring now to FIG. 1, a flowchart is illustrated as setting forth the steps of an example method for reconstructing ghost-free images from data acquired using an SMS acquisition. The method includes providing training data to a computer system, as indicated at step 102. In some examples, providing the training data to the computer system includes retrieving previously acquired data from a data storage. In some other example, providing the training data to the computer system includes acquiring training data with an MRI system. In these latter examples, the computer system may form a part of the MRI system. The training data generally includes two sets of data acquired for each of a plurality of different slices using alternating readout polarities that are opposite between the two sets of training data. In some examples, the training data can be autocalibration signal ("ACS") data. In some specific examples, the training data can be acquired using a fast low-angle excitation echo-planar technique ("FLEET")-ACS method.

Figure 2:
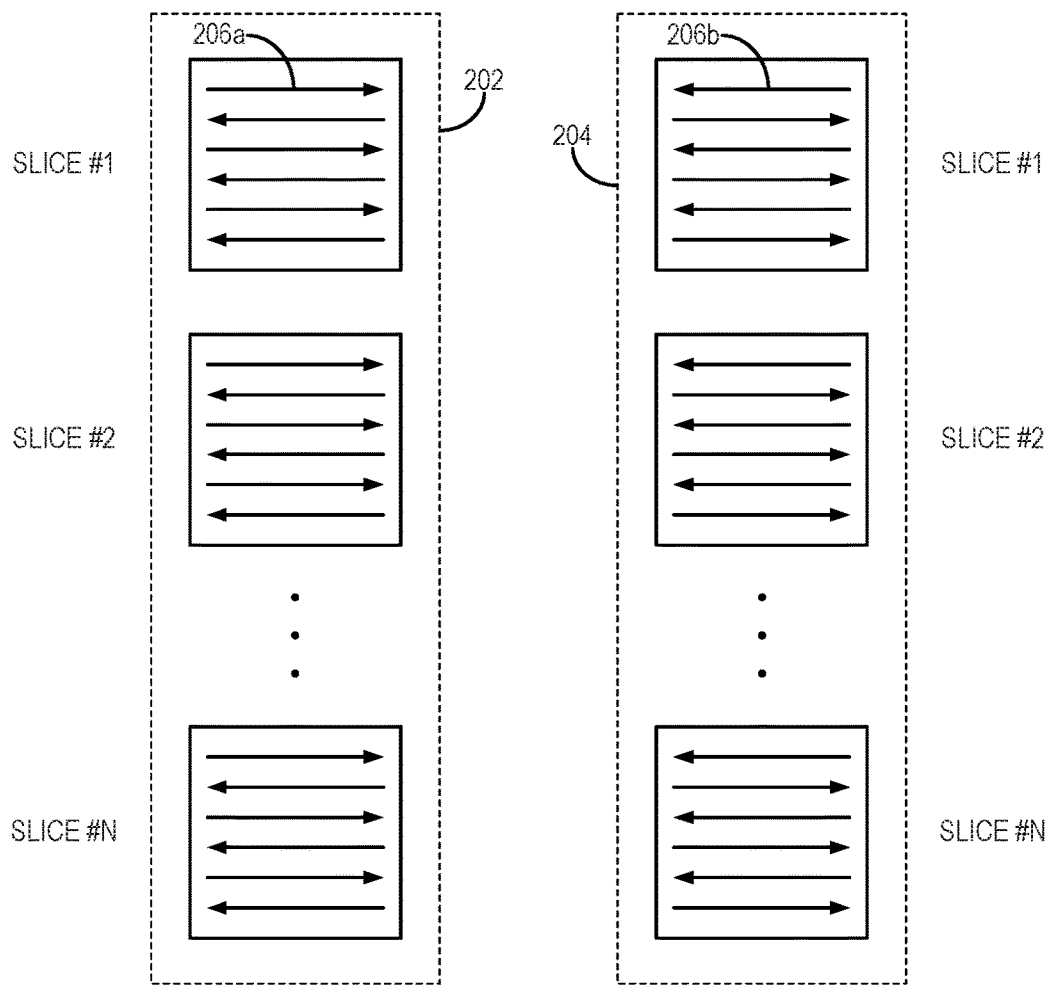
FIG. 2 is an illustration of dual-polarity training data.

One, non-limiting example, of two training data sets that can be provided include two sets of data acquired from the same slices, but using opposite readout polarities. An example of such data is shown in FIG. 2, which depicts a first set of training data 202 acquired using a first set of alternating readout gradients to acquire data from a number of different slices and a second set of training data 204 acquired using a second set of alternating readout gradients to acquire data from each of the same slices. Here, the polarity of the first and second alternating readout gradients are opposite, such that a line of k-space 206a in the first data set 202 will be acquired with a positive readout polarity while the same line of k-space data 206b in the second data set 204 will be acquired with a negative readout polarity.

Referring again to FIG. 1, the training data are processed to generate ghost-free data for each slice, as indicated at step 104. Because the training data is acquired twice with opposite readout polarities, these two sets of training data can be combined into ghost-free slice data. As one example, a ghost elimination via spatial and temporal encoding ("GESTE") method can be used to generate the ghost-free slice data. The generation of ghost-free target data, source data, or both, is not limited to the GESTE technique or to the use of two or more frames of training or calibration data. This ghost correction can eliminate not only zeroth-order and first-order Nyquist ghosts (e.g., those arising from phase errors in the $k_x$ direction), but also so-called "oblique ghosts" (e.g., those arising from phase errors in the $k_y$ direction). The GESTE method is described, for example, by W. S. Hoge, et al., in "Robust EPI Nyquist Ghost Elimination via Spatial and Temporal Encoding (EPI-GESTE)," *Magnetic Resonance in Medicine,* 2010; 64(6):1781-1791. Other ghost correction techniques aimed at providing temporal stability of ghost correction and protection against scanner drift in EPI time-series data can also be used, including previously described strategies such as correcting for the slice-averaged ghost of SMS-EPI at each timepoint using collapsed navigator signals measured at each time point.

Figure 3:
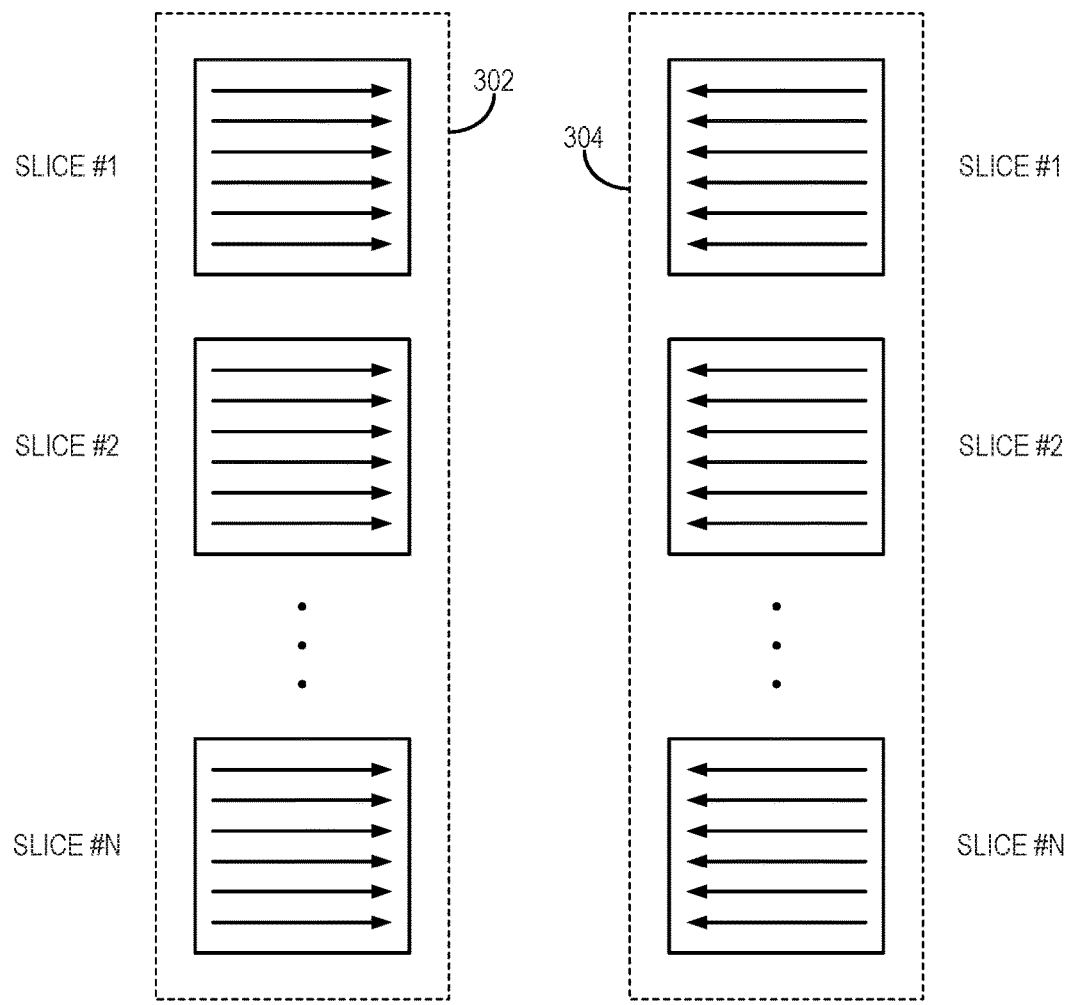
FIG. 3 is an illustration of polarity-matched training data.

The training data are also resorted line-by-line and interleaved to form polarity matched data sets, each containing lines of k-space acquired with the same readout polarity, as indicated at step 106. As a result of this step, a positive readout frame (RO+) and a negative readout frame (RO−) is generated for each slice, as shown in FIG. 3, which depicts an RO+ data set 302 for N slices and an RO− data set 304 for the same N slices.

The positive and negative readout frames are then processed to form synthesized collapsed slice data, as indicated at step 108. For example, all of the positive readout frames can be combined (e.g., added, averaged) to form synthesized collapsed slice data for the positive readouts, and all of the negative readout frames can be combined (e.g., added, averaged) to form synthesized collapsed slice data for the negative readouts. This synthesized collapsed slice data emulates data acquired using an SMS acquisition, which results in signals from the different slices to be aliased, or collapsed, into a single image plane.

An SMS reconstruction is then trained using the synthesized collapsed slice data, which still contain phase errors, as source data, and using the ghost-free slice data as target data. Using this technique, the ghost correction is embedded directly into the SMS reconstruction. Thus, as indicated at step 110, the method proceeds with using the synthesized collapsed slice data and the ghost-free data to generate reconstruction kernels for the different slices. In general, the reconstruction kernels are generated using a training procedure with the synthesized collapsed slice data as an input, or source data, and the ghost-free data as target data. As one example, the synthesized collapsed slices are used in a slice-GRAPPA kernel training procedure as source data, but using the ghost-free frame as target data. The resulting slice-GRAPPA kernels can both separate slices acquired with an SMS acquisition while correcting for ghost artifacts.

Data are then simultaneously acquired from multiple different slices using an SMS acquisition, as indicated at step 112. As one non-limiting example, the data can be acquired using a two-dimensional SMS-EPI acquisition. In other examples, the data can be acquired using other SMS acquisitions or simultaneous multi-slab acquisitions using 3D-EPI, echo-volumetric imaging ("EVI"), GRASE, multi-echo EPI, and other variants of such acquisition schemes.

Images for each slice are then reconstructed from the SMS data by applying the reconstruction kernels to the acquired SMS data, as indicated at step 114. For each reconstructed slice, a distinct reconstruction kernel is applied. As one example, the reconstruction kernels can be applied using a convolution operation.

If in-plane acceleration is implemented in addition to the SMS (i.e., through-plane) acceleration, care should be taken to utilize in-plane reconstruction kernels that do not inadvertently reintroduce phase errors into the reconstructed data. One solution is to train the in-plane kernels using the ghost-free slice data as both source and target data during a kernel fitting, and applying this new kernel to the in-plane-accelerated SMS data after the DPG slice-GRAPPA processing mentioned above.

Figure 4:
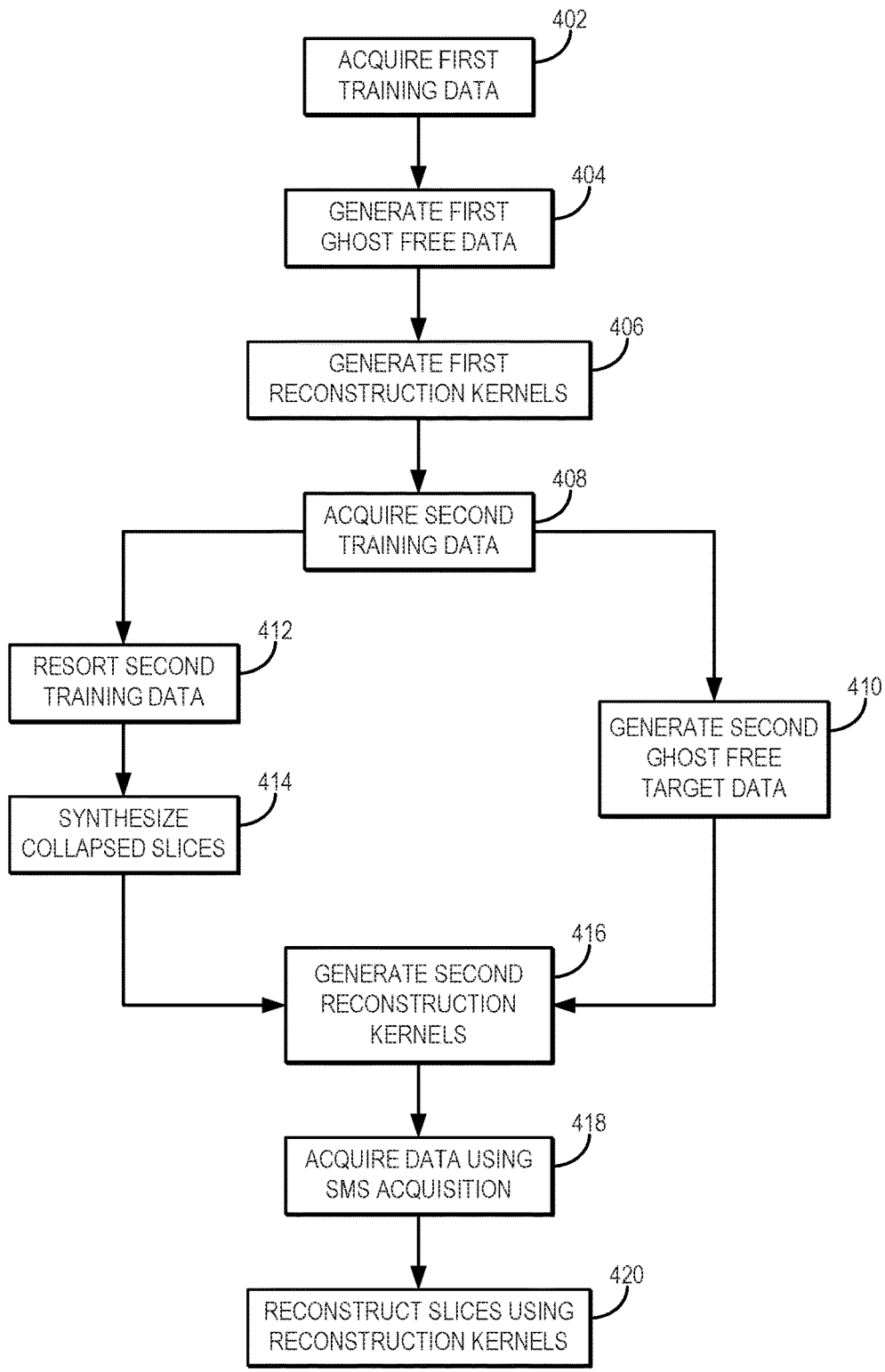
FIG. 4 is a flowchart setting forth the steps of another example method for reconstructing ghost-free images from data acquired using an SMS acquisition.

Referring now to FIG. 4, a flowchart is illustrated as setting forth another example method for reconstructing ghost-free images from data acquired using an SMS acquisition. The method includes acquiring first training data, as indicated at step 402. The first training data includes two sets of data acquired for each of a plurality of different slices using alternating readout polarities that are opposite between the two sets of training data, as described above. In some examples, the first training data can be ACS data. In some specific examples, the first training data can be acquired using a FLEET-ACS method.

First ghost-free data are then generated from the first training data, as indicated at step 404. As described above, this first ghost-free data can be generated using a GESTE method. Based on the first ghost-free data, first reconstruction kernels are computed, as indicated at step 406. These first reconstruction kernels account for reconstructing images from in-plane accelerated data. In some example, the first reconstruction kernels can include GRAPPA parameters.

Second training data are then acquired, as indicated at step 408. The second training data are acquired using in-plane acceleration. Like the first training data, the second training data is temporally encoded and includes two sets of data acquired for each of a plurality of different slices using alternating readout polarities that are opposite between the two sets of training data. The second training data is also acquired using the same echo time ("TE") and echo-train-length ("ETL") that will be later used when acquiring data using an SMS acquisition.

The second training data are processed to generate second ghost-free data for each slice, as indicated at step 410. As one example, a GESTE method can be used to generate the second ghost-free slice data. The generation of ghost-free target data, source data, or both, is not limited to the GESTE technique or to the use of two or more frames of training or calibration data.

The second training data are also resorted line-by-line and interleaved to form polarity matched data sets, each containing lines of k-space acquired with the same readout polarity, as indicated at step 412. As a result of this step, a positive readout frame (RO+) and a negative readout frame (RO−) is generated for each slice.

The positive and negative readout frames are then processed to form synthesized collapsed slice data, as indicated at step 414. For example, all of the positive readout frames can be combined (e.g., added, averaged) to form synthesized collapsed slice data for the positive readouts, and all of the negative readout frames can be combined (e.g., added, averaged) to form synthesized collapsed slice data for the negative readouts. This synthesized collapsed slice data emulates data acquired using an SMS acquisition, which results in signals from the different slices to be aliased, or collapsed, into a single image plane.

An SMS reconstruction is then trained using the synthesized collapsed slice data, which still contain phase errors, as source data, and using the second ghost-free slice data as target data. Using this technique, the ghost correction is embedded directly into the SMS reconstruction. Thus, as indicated at step 416, the method proceeds with using the synthesized collapsed slice data and the second ghost-free data to generate second reconstruction kernels for the different slices.

In some examples, source images are first reconstructed from the collapsed slice data and target images are first reconstructed from the second ghost-free data. In these examples, the first reconstruction kernels can be used to implement these image reconstructions. The source and target images can then be used in the training process.

In general, the second reconstruction kernels are generated using a training procedure with the synthesized collapsed slice data as an input, or source data, and the second ghost-free data as target data. As one example, the synthesized collapsed slices are used in a slice-GRAPPA kernel training procedure as source data, but using the second ghost-free frame as target data. The resulting slice-GRAPPA kernels can both separate slices acquired with an SMS acquisition while correcting for ghost artifacts.

Data are then simultaneously acquired from multiple different slices using an SMS acquisition, as indicated at step 418. As mentioned above, these data are acquired using the same TE and ETL settings as was used to acquire the second training data. In doing so, the quality of the resulting separated slice images can be improved. As one non-limiting example, the data can be acquired using a two-dimensional SMS-EPI acquisition. In other examples, the data can be acquired using other SMS acquisitions or simultaneous multi-slab acquisitions using 3D-EPI, echo-volumetric imaging ("EVI"), GRASE, multiecho EPI, and other variants of such acquisition schemes.

Images for each slice are then reconstructed from the SMS data by applying the second reconstruction kernels to the acquired SMS data, as indicated at step 420. For each reconstructed slice, a distinct reconstruction kernel is applied. As one example, the second reconstruction kernels can be applied using a convolution operation.

Figure 5:
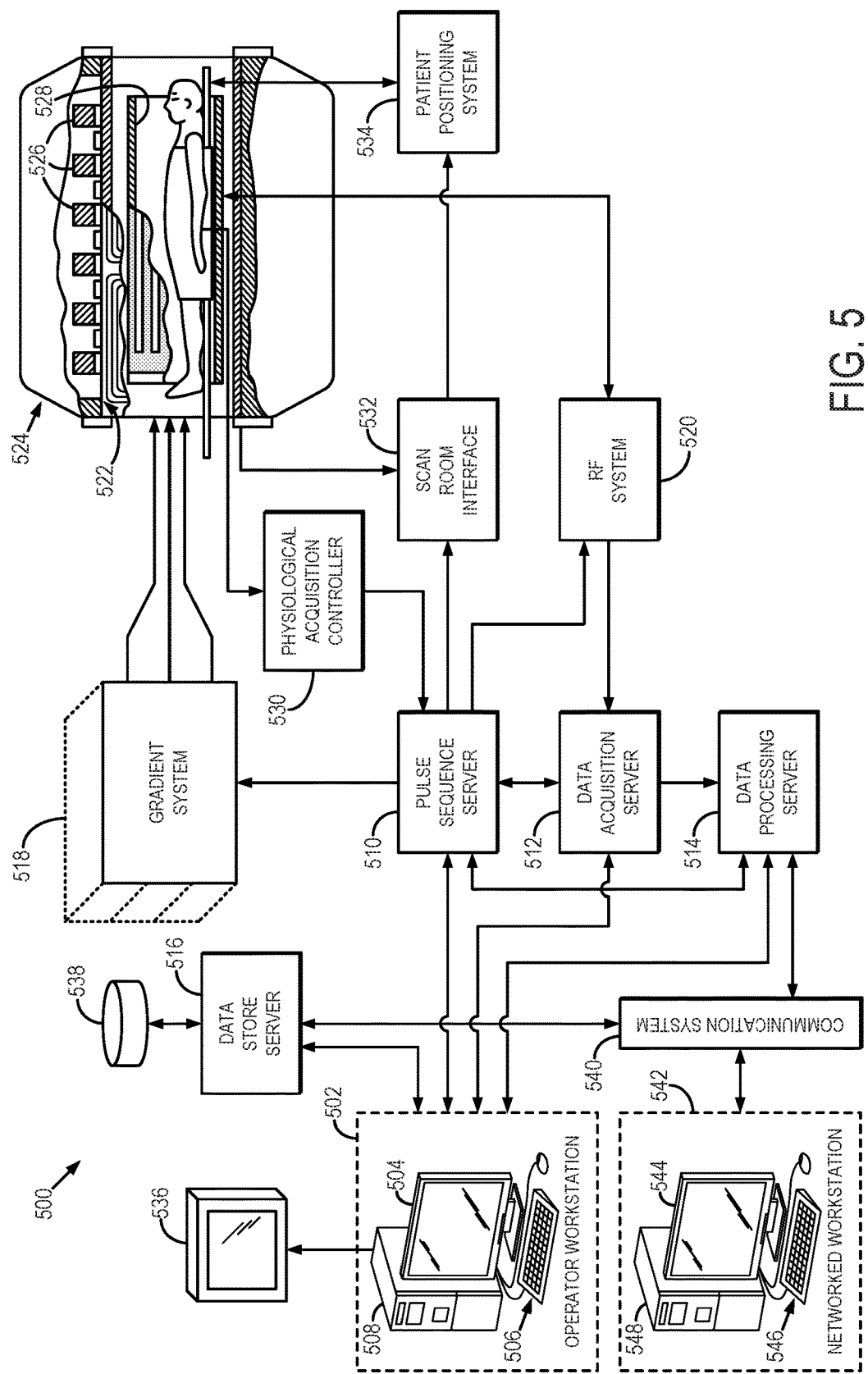
FIG. 5 is a block diagram of an example magnetic resonance imaging ("MRI") system that can implement the methods described here.

Referring particularly now to FIG. 5, an example of an MRI system 500 that can implement the methods described here is illustrated. The MRI system 500 includes an operator workstation 502 that may include a display 504, one or more input devices 506 (e.g., a keyboard, a mouse), and a processor 508. The processor 508 may include a commercially available programmable machine running a commercially available operating system. The operator workstation 502 provides an operator interface that facilitates entering scan parameters into the MRI system 500. The operator workstation 502 may be coupled to different servers, including, for example, a pulse sequence server 510, a data acquisition server 512, a data processing server 514, and a data store server 516. The operator workstation 502 and the servers 510, 512, 514, and 516 may be connected via a communication system 540, which may include wired or wireless network connections.

The pulse sequence server 510 functions in response to instructions provided by the operator workstation 502 to operate a gradient system 518 and a radiofrequency ("RF") system 520. Gradient waveforms for performing a prescribed scan are produced and applied to the gradient system 518, which then excites gradient coils in an assembly 522 to produce the magnetic field gradients $G_x$, $G_y$, and $G_z$ that are used for spatially encoding magnetic resonance signals. The gradient coil assembly 522 forms part of a magnet assembly 524 that includes a polarizing magnet 526 and a whole-body RF coil 528.

RF waveforms are applied by the RF system 520 to the RF coil 528, or a separate local coil to perform the prescribed magnetic resonance pulse sequence. Responsive magnetic resonance signals detected by the RF coil 528, or a separate local coil, are received by the RF system 520. The responsive magnetic resonance signals may be amplified, demodulated, filtered, and digitized under direction of commands produced by the pulse sequence server 510. The RF system 520 includes an RF transmitter for producing a wide variety of RF pulses used in MRI pulse sequences. The RF transmitter is responsive to the prescribed scan and direction from the pulse sequence server 510 to produce RF pulses of the desired frequency, phase, and pulse amplitude waveform. The generated RF pulses may be applied to the whole-body RF coil 528 or to one or more local coils or coil arrays.

The RF system 520 also includes one or more RF receiver channels. An RF receiver channel includes an RF preamplifier that amplifies the magnetic resonance signal received by the coil 528 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \quad (1);$$

and the phase of the received magnetic resonance signal may also be determined according to the following relationship:

$$\varphi = \tan^{-1}\left(\frac{Q}{I}\right). \quad (2)$$

The pulse sequence server 510 may receive patient data from a physiological acquisition controller 530. By way of example, the physiological acquisition controller 530 may receive signals from a number of different sensors connected to the patient, including electrocardiograph ("ECG") signals from electrodes, or respiratory signals from a respiratory bellows or other respiratory monitoring devices. These signals may be used by the pulse sequence server 510 to synchronize, or "gate," the performance of the scan with the subject's heart beat or respiration.

The pulse sequence server 510 may also connect to a scan room interface circuit 532 that receives signals from various sensors associated with the condition of the patient and the magnet system. Through the scan room interface circuit 532, a patient positioning system 534 can receive commands to move the patient to desired positions during the scan.

The digitized magnetic resonance signal samples produced by the RF system 520 are received by the data acquisition server 512. The data acquisition server 512 operates in response to instructions downloaded from the operator workstation 502 to receive the real-time magnetic resonance data and provide buffer storage, so that data is not lost by data overrun. In some scans, the data acquisition server 512 passes the acquired magnetic resonance data to the data processor server 514. In scans that require information derived from acquired magnetic resonance data to control the further performance of the scan, the data acquisition server 512 may be programmed to produce such information and convey it to the pulse sequence server 510. For example, during pre-scans, magnetic resonance data may be acquired and used to calibrate the pulse sequence performed by the pulse sequence server 510. As another example, navigator signals may be acquired and used to adjust the operating parameters of the RF system 520 or the gradient system 518, or to control the view order in which k-space is sampled. In still another example, the data acquisition server 512 may also process magnetic resonance signals used to detect the arrival of a contrast agent in a magnetic resonance angiography ("MRA") scan. For example, the data acquisition server 512 may acquire magnetic resonance data and processes it in real-time to produce information that is used to control the scan.

The data processing server 514 receives magnetic resonance data from the data acquisition server 512 and processes the magnetic resonance data in accordance with instructions provided by the operator workstation 502. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 514 are conveyed back to the operator workstation 502 for storage. Real-time images may be stored in a data base memory cache, from which they may be output to operator display 502 or a display 536. Batch mode images or selected real time images may be stored in a host database on disc storage 538. When such images have been reconstructed and transferred to storage, the data processing server 514 may notify the data store server 516 on the operator workstation 502. The operator workstation 502 may be used by an operator to archive the images, produce films, or send the images via a network to other facilities.

The MRI system 500 may also include one or more networked workstations 542. For example, a networked workstation 542 may include a display 544, one or more input devices 546 (e.g., a keyboard, a mouse), and a processor 548. The networked workstation 542 may be located within the same facility as the operator workstation 502, or in a different facility, such as a different healthcare institution or clinic.

The networked workstation 542 may gain remote access to the data processing server 514 or data store server 516 via the communication system 540. Accordingly, multiple networked workstations 542 may have access to the data processing server 514 and the data store server 516. In this manner, magnetic resonance data, reconstructed images, or other data may be exchanged between the data processing server 514 or the data store server 516 and the networked workstations 542, such that the data or images may be remotely processed by a networked workstation 542.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for reconstructing images of a subject using a magnetic resonance imaging (MRI) system, the steps of the method comprising:

(a) providing to a computer system, training data acquired from a subject, wherein the training data includes first training data acquired from a plurality of different slices in the subject using a first series of alternating readout gradients, and second training data acquired from the plurality of different slices in the subject using a second series of alternating readout gradients that have opposite polarity from the first series of alternating readout gradients;

(b) generating from the training data with the computer system, ghost-free data for each of the plurality of different slices in the subject;

(c) generating with the computer system, positive readout data by combining k-space lines in the first training data acquired with a positive readout gradient and k-space lines in the second training data acquired with a positive readout gradient;

(d) generating with the computer system, negative readout data by combining k-space lines in the first training data acquired with a negative readout gradient and k-space lines in the second training data acquired with a negative readout gradient;

(e) synthesizing from the positive readout data with the computer system, first collapsed slice data that synthesizes the positive readout data from each of the plurality of different slices in the subject as having been acquired simultaneously;

(f) synthesizing from the negative readout data with the computer system, second collapsed slice data that synthesizes the negative readout data from each of the plurality of different slices in the subject as having been acquired simultaneously;

(g) computing with the computer system, a reconstruction kernel for each of the plurality of different slice locations in the subject using a training algorithm in which the first and second collapsed slice data are used as source data and the ghost-free data are used as target data;

(h) acquiring data simultaneously from the plurality of different slices in the subject using an MRI system performing a simultaneous multislice acquisition pulse sequence;

(i) reconstructing images of each of the plurality of different slices by applying the reconstruction kernels to the acquired data with the computer system, wherein the images are substantially free from ghost artifacts.

2. The method as recited in claim 1, wherein the training data includes autocalibration signal data.

3. The method as recited in claim 1, wherein step (b) includes generating the ghost-free data by correcting the first and second training data for phase errors in at least a $k_x$-direction in k-space.

4. The method as recited in claim 3, wherein step (b) includes generating the ghost-free data by correcting the first and second training data for phase errors in both the $k_x$-direction in k-space and a $k_y$-direction in k-space.

5. The method as recited in claim 1, wherein the ghost-free data are generated using a ghost elimination via spatial and temporal encoding method.

6. The method as recited in claim 1, wherein the reconstruction kernels are computed in step (g) using a slice-GRAPPA training procedure.

7. The method as recited in claim 1, wherein step (h) includes acquiring the data using in-plane acceleration.

8. The method as recited in claim 7, wherein the reconstruction kernels computed in step (g) account for both in-plane and through-plane acceleration, and wherein the training algorithm also uses the ghost-free data as source data.

9. A computer-implemented method for computing reconstruction kernels for reconstructing images from magnetic resonance data simultaneously acquired from a plurality of different slices in a subject using a magnetic resonance imaging (MRI) system, the steps of the method comprising:
(a) acquiring first training data from the plurality of different slices in the subject using the MRI system performing a first pulse sequence having a first series of alternating readout gradients;
(b) acquiring second training data from the plurality of different slices in the subject using the MRI system performing a second pulse sequence having a second series of alternating readout gradients that have opposite polarity from the first series of alternating readout gradients;
(c) generating from the first and second training data with a computer system, ghost-free data for each of the plurality of different slices in the subject;
(d) synthesizing from the first and second training data with the computer system, collapsed slice data that synthesizes the first and second training data from each of the plurality of different slices in the subject as having been acquired simultaneously;
(g) computing with the computer system, a reconstruction kernel for each of the plurality of different slice locations in the subject using a training algorithm in which the collapsed slice data are used as source data and the ghost-free data are used as target data; and
(h) storing the reconstruction kernels in the computer system.

10. The method as recited in claim 9, wherein the first and second training data include autocalibration signal data.

11. The method as recited in claim 9, wherein step (c) includes generating the ghost-free data by correcting the first and second training data for phase errors in at least a $k_x$-direction in k-space.

12. The method as recited in claim 11, wherein step (c) includes generating the ghost-free data by correcting the first and second training data for phase errors in both the $k_x$-direction in k-space and a $k_y$-direction in k-space.

13. The method as recited in claim 9, wherein the ghost-free data are generated using a ghost elimination via spatial and temporal encoding method.

14. The method as recited in claim 9, wherein the reconstruction kernels are computed in step (g) using a slice-GRAPPA training procedure.

15. The method as recited in claim 9, wherein the reconstruction kernels computed in step (g) account for both in-plane and through-plane acceleration, and wherein the training algorithm also uses the ghost-free data as source data.

16. The method as recited in claim 9, wherein step (d) includes:
generating with the computer system, positive readout data by combining k-space lines in the first training data acquired with a positive readout gradient and k-space lines in the second training data acquired with a positive readout gradient;
generating with the computer system, negative readout data by combining k-space lines in the first training data acquired with a negative readout gradient and k-space lines in the second training data acquired with a negative readout gradient;
synthesizing from the positive readout data with the computer system, first collapsed slice data that synthesizes the positive readout data from each of the plurality of different slices in the subject as having been acquired simultaneously;
synthesizing from the negative readout data with the computer system, second collapsed slice data that synthesizes the negative readout data from each of the plurality of different slices in the subject as having been acquired simultaneously; and
wherein the collapsed slice data comprises the first and second collapsed slice data.

* * * * *